US010692812B2

(12) United States Patent
Srivastava et al.

(10) Patent No.: US 10,692,812 B2
(45) Date of Patent: Jun. 23, 2020

(54) INTERCONNECTS WITH VARIABLE SPACE MANDREL CUTS FORMED BY BLOCK PATTERNING

(71) Applicant: GLOBALFOUNDRIES Inc., Grand Cayman (KY)

(72) Inventors: Ravi Prakash Srivastava, Clifton Park, NY (US); Hui Zang, Guilderland, NY (US); Jiehui Shu, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 28 days.

(21) Appl. No.: 15/980,085

(22) Filed: May 15, 2018

(65) Prior Publication Data

US 2019/0355658 A1 Nov. 21, 2019

(51) Int. Cl.
    H01L 23/528    (2006.01)
    H01L 23/522    (2006.01)
    H01L 21/768    (2006.01)
    H01L 21/308    (2006.01)
    H01L 21/02     (2006.01)
    H01L 21/033    (2006.01)

(52) U.S. Cl.
    CPC ........ *H01L 23/528* (2013.01); *H01L 21/0226* (2013.01); *H01L 21/0332* (2013.01); *H01L 21/0337* (2013.01); *H01L 21/3081* (2013.01); *H01L 21/76816* (2013.01); *H01L 21/76877* (2013.01); *H01L 21/76892* (2013.01); *H01L 23/5226* (2013.01)

(58) Field of Classification Search
    CPC ............... H01L 21/0226; H01L 23/528; H01L 21/76892; H01L 21/0332; H01L 21/3081; H01L 21/76816; H01L 21/76802–76816; H01L 21/0337–0338
    See application file for complete search history.

(56) References Cited

U.S. PATENT DOCUMENTS

| 9,177,797 | B2 | 11/2015 | Chang et al. | |
| 9,711,447 | B1 | 7/2017 | Shu et al. | |
| 9,852,986 | B1 | 12/2017 | Stephens et al. | |
| 2014/0252630 | A1 | 9/2014 | Chang et al. | |
| 2014/0273433 | A1* | 9/2014 | Lee | H01L 21/76816 438/637 |
| 2015/0340233 | A1 | 11/2015 | Huang et al. | |
| 2018/0096846 | A1* | 4/2018 | Arnold | H01L 21/0337 |
| 2018/0182786 | A1* | 6/2018 | Zhang | H01L 21/02164 |

* cited by examiner

*Primary Examiner* — Selim U Ahmed
*Assistant Examiner* — Evan G Clinton
(74) *Attorney, Agent, or Firm* — Thompson Hine LLP; Anthony Canale

(57) ABSTRACT

Methods of fabricating an interconnect structure. A hardmask is deposited over an interlayer dielectric layer, and a block mask is formed that covers an area on the hardmask. A sacrificial layer is formed over the block mask and the hardmask, and the sacrificial layer is patterned to form a mandrel that extends across the block mask.

20 Claims, 6 Drawing Sheets

INTERCONNECTS WITH VARIABLE SPACE MANDREL CUTS FORMED BY BLOCK PATTERNING

BACKGROUND

The present invention relates to semiconductor device fabrication and integrated circuits and, more specifically, to methods of self-aligned multiple patterning.

A back-end-of-line (BEOL) interconnect structure may be used to connect device structures, which have been fabricated on a substrate during front-end-of-line (FEOL) processing, with each other and with the environment external to the chip. Self-aligned patterning processes used to form a BEOL interconnect structure involve linear mandrels acting as sacrificial features that establish a feature pitch. Non-mandrel lines are arranged as linear spaces between sidewall spacers that are formed adjacent to the sidewalls of the mandrels. After the mandrels are pulled to define mandrel lines, the sidewall spacers are used as an etch mask to etch a pattern predicated on the mandrel lines and the non-mandrel lines into an underlying hardmask. The pattern is subsequently transferred from the hardmask to an interlayer dielectric layer to define trenches in which the wires of the BEOL interconnect structure are formed.

Mandrel cuts may be formed in the mandrels in order to section the mandrels and define discontinuities between the sections. Non-mandrel cuts may also be formed along non-mandrel lines and may include portions of the spacer material used to form the sidewall spacers. The mandrel cuts and non-mandrel cuts are included in the pattern that is transferred to the hardmask and subsequently transferred from the hardmask to form the trenches in the interlayer dielectric layer. The mandrel cuts and non-mandrel cuts appear in the BEOL interconnect structure as adjacent wires that are spaced apart at their tips with a tip-to-tip spacing related to the dimension of the discontinuity.

The tip-to-tip spacing for a cut mandrel is limited to a distance equal to twice the thickness of the sidewall spacers. If the tip-to-tip spacing is greater than this distance, the sidewall spacers do not merge within the mandrel cut between the sections of the mandrel, which results in incomplete filling of the mandrel cut. Transverse to the length of the cut mandrel, the mandrel cut is arranged in the pattern between non-mandrel lines that flank the cut mandrel line. The result of the incomplete filling can be a short between wires in the BEOL interconnect structure formed using the non-mandrel lines at the location of the mandrel cut. In addition, the wrapping of the sidewall spacers about the tips of the sections of the cut mandrel may introduce notches or indents at the side edges of the merged sidewall spacers. These notches or indents may form metal asperities that project from the side edges of wires formed using the adjacent non-mandrel lines into the mandrel cut. The proximity of these metal asperities may also result in shorting of wires in the BEOL interconnect structure formed using the non-mandrel lines.

Improved methods of self-aligned multiple patterning are needed.

SUMMARY

In an embodiment of the invention, a method includes depositing a hardmask over an interlayer dielectric layer, forming a block mask that covers an area on the hardmask, forming a sacrificial layer over the block mask and the hardmask, and patterning the sacrificial layer to form a mandrel that extends across the block mask.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
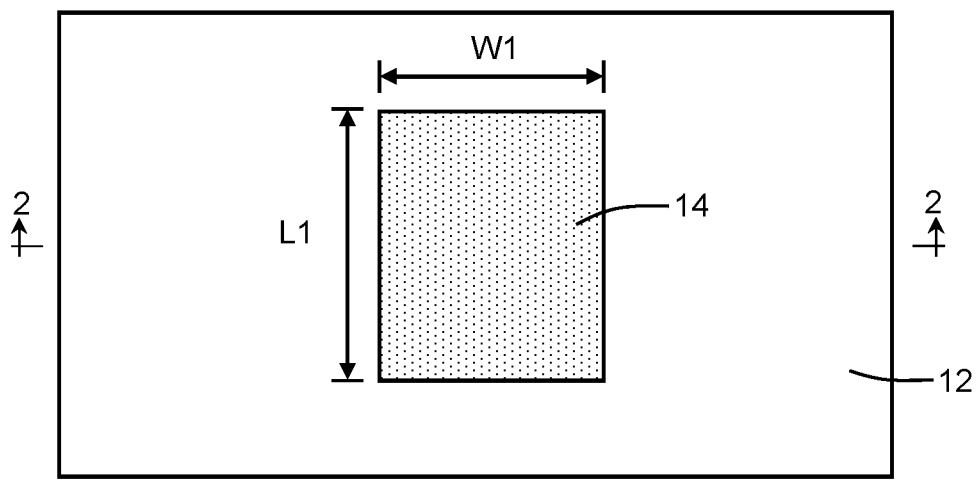
FIG. 1 is a top view of a structure at an initial fabrication stage of a processing method in accordance with embodiments of the invention.
Figure 2:
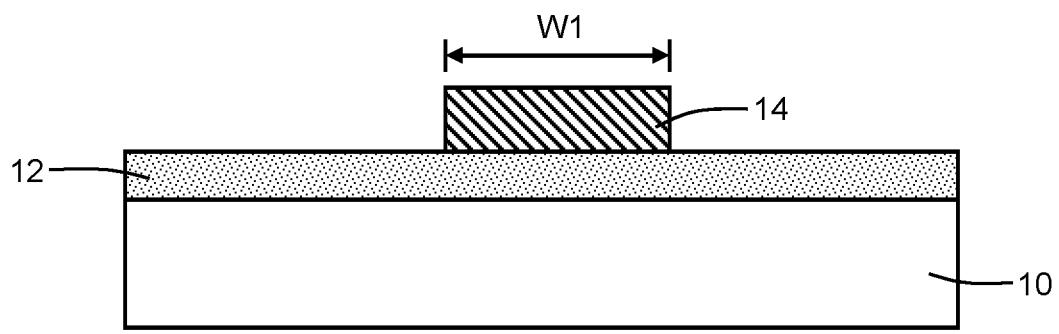
FIG. 2 is a cross-sectional view taken generally along line 2-2 in FIG. 1.

With reference to FIGS. 1, 2 and in accordance with embodiments of the invention, an interlayer dielectric layer 10 may be comprised of an electrically-insulating dielectric material, such as hydrogen-enriched silicon oxycarbide (Si-COH) or another type of low-k dielectric material. The interlayer dielectric layer 10 may be located on a substrate that includes device structures fabricated by front-end-of-line (FEOL) processing to form an integrated circuit. A hardmask 12 is located on the top surface of the interlayer dielectric layer 10. The hardmask 12 may be comprised of a metal, such as titanium nitride (TiN), deposited by physical vapor deposition (PVD) and/or a dielectric material, such as silicon nitride ($Si_3N_4$), deposited by chemical vapor deposition (CVD). The hardmask 12 is removable from the interlayer dielectric layer 10 selective to the material of the interlayer dielectric layer 10. As used herein, the term "selective" in reference to a material removal process (e.g., etching) denotes that the material removal rate (i.e., etch rate) for the targeted material is higher than the material removal rate (i.e., etch rate) for at least another material exposed to the material removal process.

A block mask 14 is formed at a strategic location on the top surface of the hardmask 12 and is subsequently used in the process flow to form a mandrel cut. The block mask 14 may be formed from a layer of its constituent material that is deposited and then patterned with lithograph and etching. The block mask 14 is composed of a dielectric material, such as titanium oxide ($TiO_2$) or silicon dioxide ($SiO_2$), deposited by, for example, chemical vapor deposition (CVD). The block mask 14 is characterized by dimensions that are established during patterning. In an embodiment, the block mask 14 may be rectangular with a length, L1, and a width, W, that are established during patterning.

Figure 3:
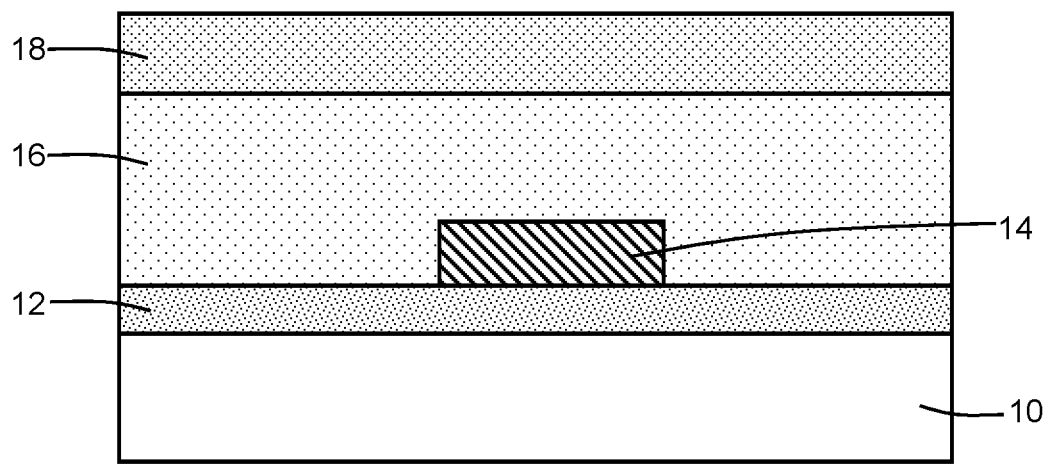
FIG. 3 is a cross-sectional view of the structure at a fabrication stage of the processing method subsequent to FIG. 2.

With reference to FIG. 3 in which like reference numerals refer to like features in FIG. 2 and at a subsequent fabrication stage of the processing method, a sacrificial layer 16 and a hardmask 18 are formed over the hardmask 12 and the block mask 14. The hardmask 18 is used for pattern transfer to the sacrificial layer 16 during multiple patterning. The sacrificial layer 16 is thicker than the block mask 14 such that the block mask 14 is buried in the sacrificial layer 16.

The dielectric material constituting the block mask 14 and the material constituting the sacrificial layer 16 are chosen such that the material of the sacrificial layer 16 can be selectively etched relative to the material of the block mask 14. The sacrificial layer 16 may be composed of a spin-on hardmask material, such as an organic planarization layer (OPL) material or amorphous silicon ($\alpha$-Si). The hardmask 18 may be composed of a dielectric material, such as silicon nitride ($Si_3N_4$), deposited by, for example, atomic layer deposition (ALD). The materials of the sacrificial layer 16 and hardmask 18 are also selected to have a high etch selectivity relative to each other. For example, the etch selectivity of silicon dioxide to silicon is approximately 10:1.

Figure 4:
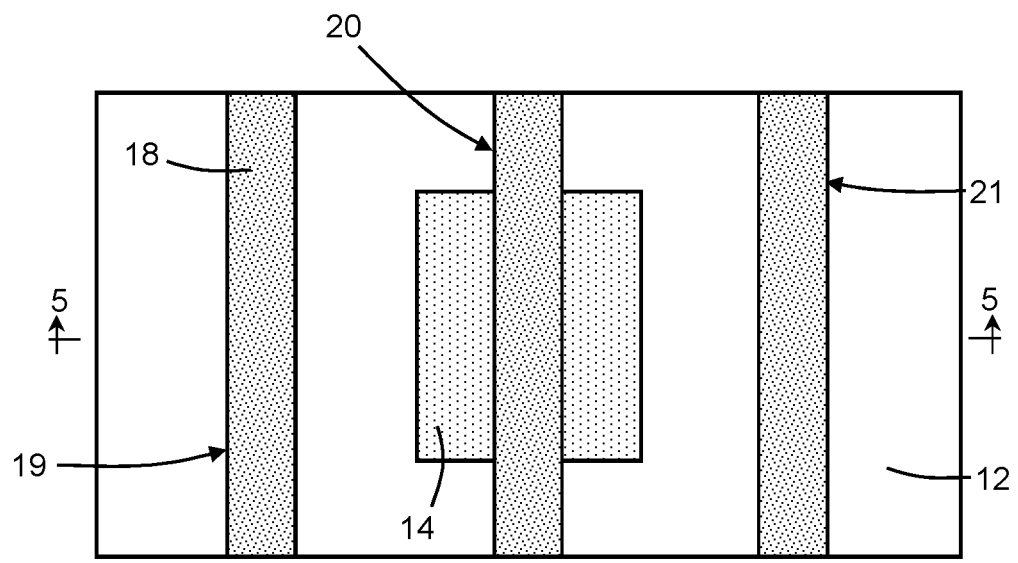
FIG. 4 is a top view of the structure at a fabrication stage of the processing method subsequent to FIG. 3.
Figure 5:
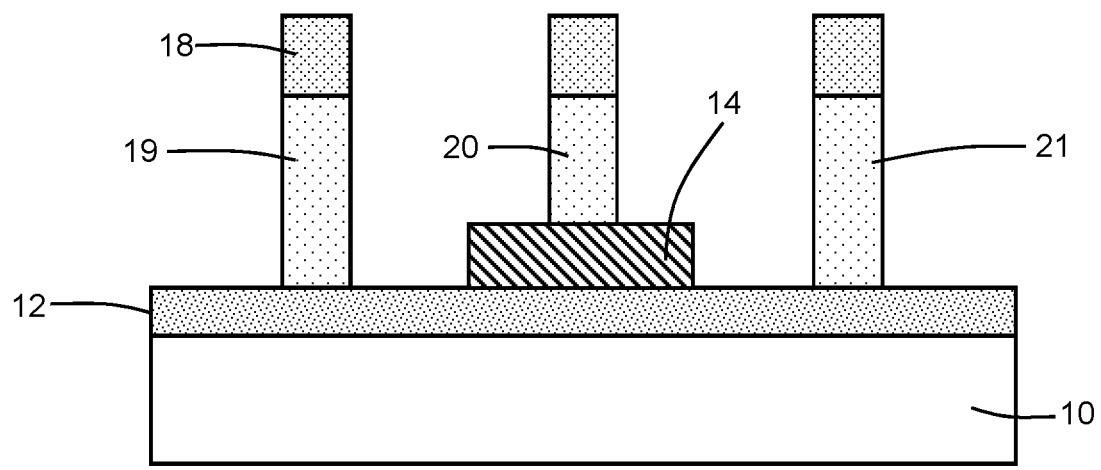
FIG. 5 is a cross-sectional view taken generally along line 5-5 in FIG. 4.

With reference to FIGS. 4, 5 in which like reference numerals refer to like features in FIG. 3 and at a subsequent fabrication stage of the processing method, mandrels 19, 20, 21 are formed from the sacrificial layer 16 and are arranged on a top surface of the hardmask 12. For example, a self-aligned double patterning (SADP) process or a self-aligned quadruple patterning (SAQP) process may be used to pattern the hardmask 18 with an etching process, which is used in turn to pattern the mandrels 19, 20, 21 with another etching process. As a result of placement during the patterning, the mandrel 20 extends across (i.e., overlaps with) the block mask 14 in a length direction parallel to the length of the block mask 14. To aid in relative placement to provide the overlap, the mandrel 20 is narrower than the block mask 14 and, as a result, the side edges of the block mask 14 are exposed between the mandrel 19 and mandrel 20 and are also exposed between the mandrel 20 and mandrel 21. In an alternative embodiment, the block mask 14 may be widened such that one or both of the mandrels 19 and 21 also extends across the block mask 14.

Figure 6:
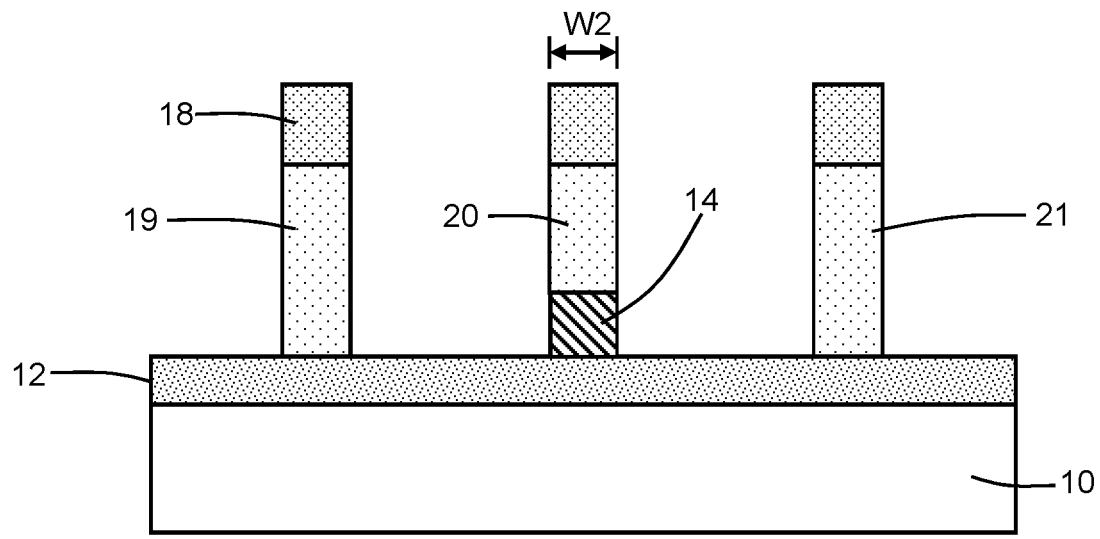
FIGS. 6-9 are cross-sectional views of the structure at successive fabrication stages subsequent to FIG. 5.

With reference to FIG. 6 in which like reference numerals refer to like features in FIG. 5 and at a subsequent fabrication stage of the processing method, the exposed side edges of the block mask 14 are trimmed and removed in a self-aligned etching process that relies on the mandrel 20 as an etch mask. The etching process may be reactive ion etching (ME) that removes the material of the block mask 14 selective to the materials of the hardmask 12 and the hardmask 18. The width, W2, of the trimmed block mask 14 is equal to the width of the mandrel 20 established when the mandrels 19, 20, 21 are formed.

Figure 7:
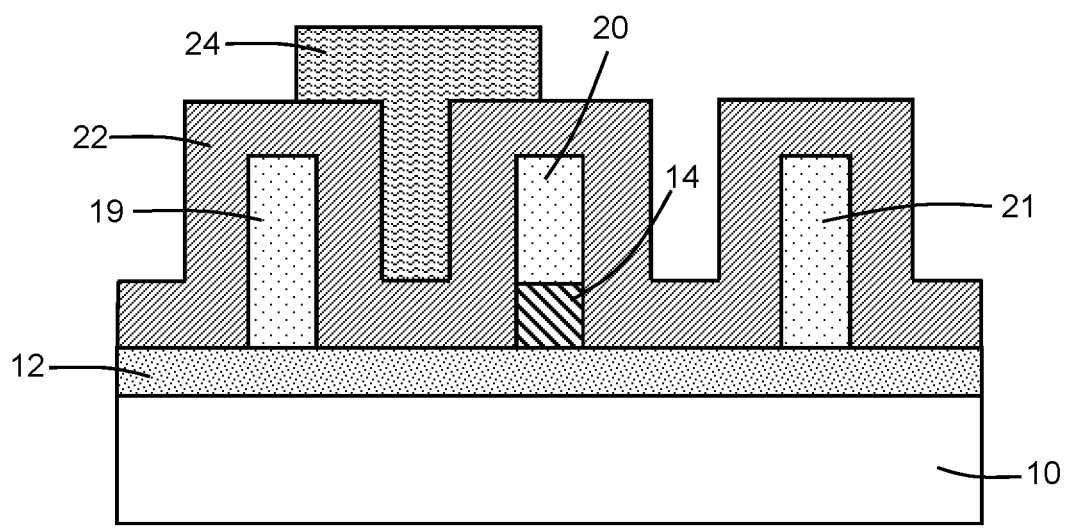

With reference to FIG. 7 in which like reference numerals refer to like features in FIG. 6 and at a subsequent fabrication stage of the processing method, the sections of the hardmask 18 are removed, and a conformal layer 22 comprised of a dielectric material is subsequently deposited using, for example, atomic layer deposition (ALD). The material constituting the conformal layer 22 may be chosen so as to be removed by a given etch chemistry selective to the material of the mandrels 19, 20, 21. For example, if the mandrels 19, 20, 21 are composed of amorphous silicon, the dielectric material constituting the conformal layer 22 may be composed of such as titanium oxide ($TiO_2$) or silicon dioxide ($SiO_2$).

The dielectric material constituting the block mask 14 is also chosen such that the mandrels 19, 20, 21, which are formed from the sacrificial layer 16, can be pulled without removing the block mask 14. In an embodiment, the dielectric material constituting the block mask 14 may be the same as the dielectric material constituting the conformal layer 22. For example, if the block mask 14 is composed of titanium oxide (TiO2), the dielectric material constituting the conformal layer 22 may be composed of titanium oxide (TiO2). As another example, if the block mask 14 is composed of silicon dioxide (SiO2), the dielectric material constituting the conformal layer 22 may be composed of silicon dioxide (SiO2).

After the conformal layer 22 is deposited, a block mask 24 is formed that covers a portion of the dielectric material of the conformal layer 22 arranged in direct contact with the hardmask 12. The block mask 24 may be composed of an organic material, such as a polymer, an organic planarization material, or another material. The block mask 24 may be formed by patterning a layer of the organic material deposited over the conformal layer 22. The block mask 24 provides a mechanism for forming a non-mandrel cut that ultimately appears as a cut in the interconnects.

Figure 8:
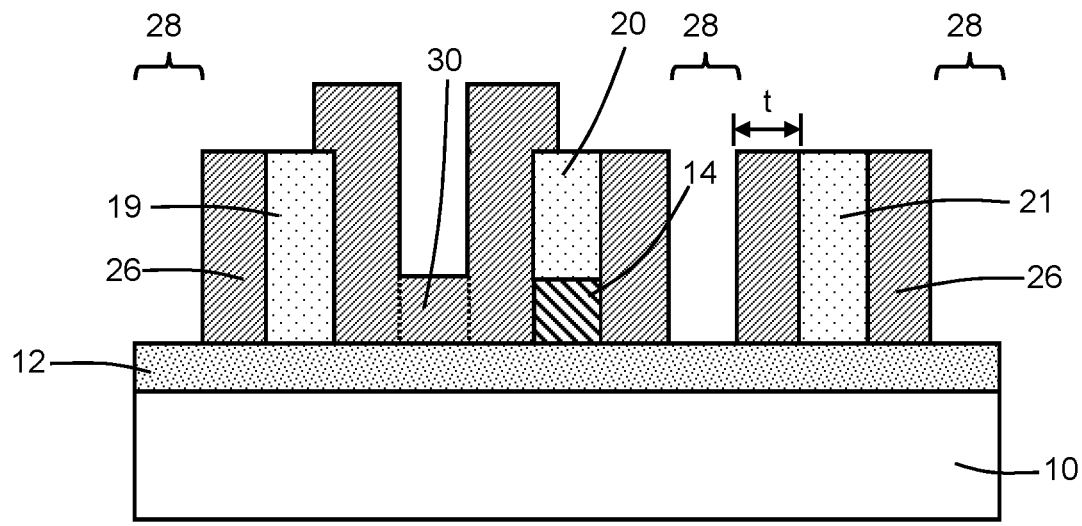

With reference to FIG. 8 in which like reference numerals refer to like features in FIG. 7 and at a subsequent fabrication stage of the processing method, sidewall spacers 26 are formed from the conformal layer 22 at locations adjacent to the vertical sidewalls of the mandrels 19, 20, 21. The sidewall spacers 26 may be formed by shaping the conformal layer 22 with an anisotropic etching process, such as reactive ion etching (RIE), that removes the material of the conformal layer 22 selective to the materials of the mandrels 19, 20, 21. The sidewall spacers 26 have a thickness, t, that may be nominally equal to the thickness of the conformal layer 22.

Non-mandrel lines 28 are defined as linear spaces arranged between the sidewall spacers 26 on the mandrels 19, 20, 21 and over which areas of the hardmask 12 are revealed. The block mask 24 masks the underlying dielectric material of the conformal layer 22, which provides a non-mandrel cut block 30 arranged in one of the non-mandrel lines 28. The block mask 24 is removed by, for example, ashing with a plasma.

Figure 9:
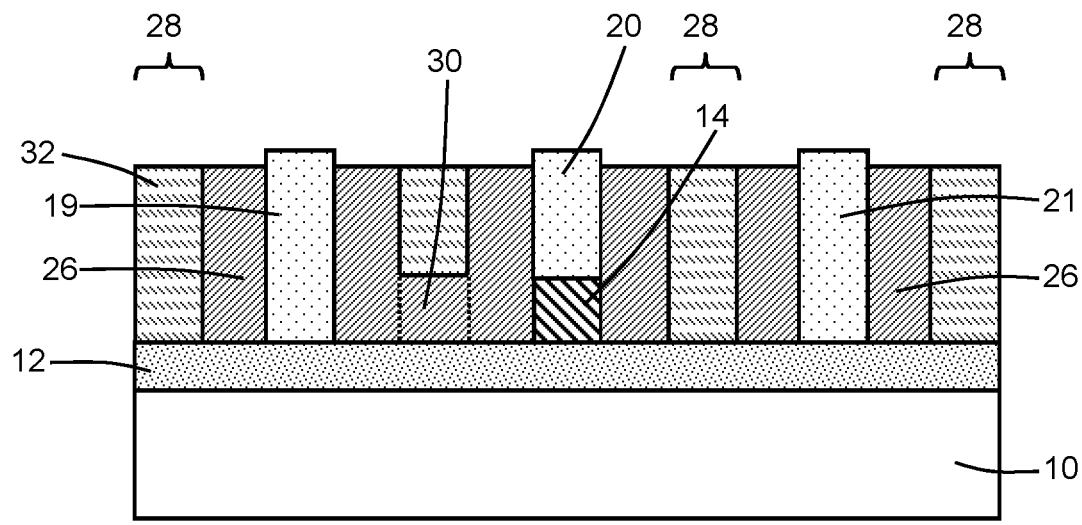

With reference to FIG. 9 in which like reference numerals refer to like features in FIG. 8 and at a subsequent fabrication stage of the processing method, a spin-on hardmask 32 is applied and recessed to fill the non-mandrel lines 28. The spin-on hardmask 32 may include an organic planarization layer (OPL) material. After the spin-on hardmask 32 is formed, an etching process is used to remove the remnants of conformal dielectric layer 22 from over the mandrels 19, 20 that were protected by the block mask 24 during spacer formation. The non-mandrel cut block 30 is protected by the spin-on hardmask 32 during the etching process.

Figure 10:
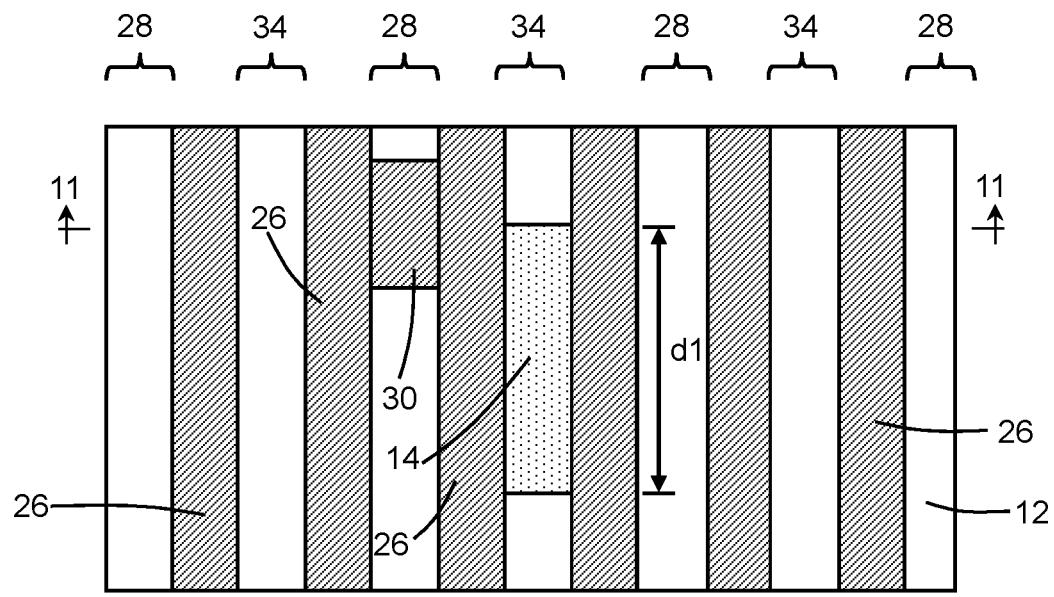
FIG. 10 is a top view of the structure at a fabrication stage of the processing method subsequent to FIG. 9.
Figure 11:
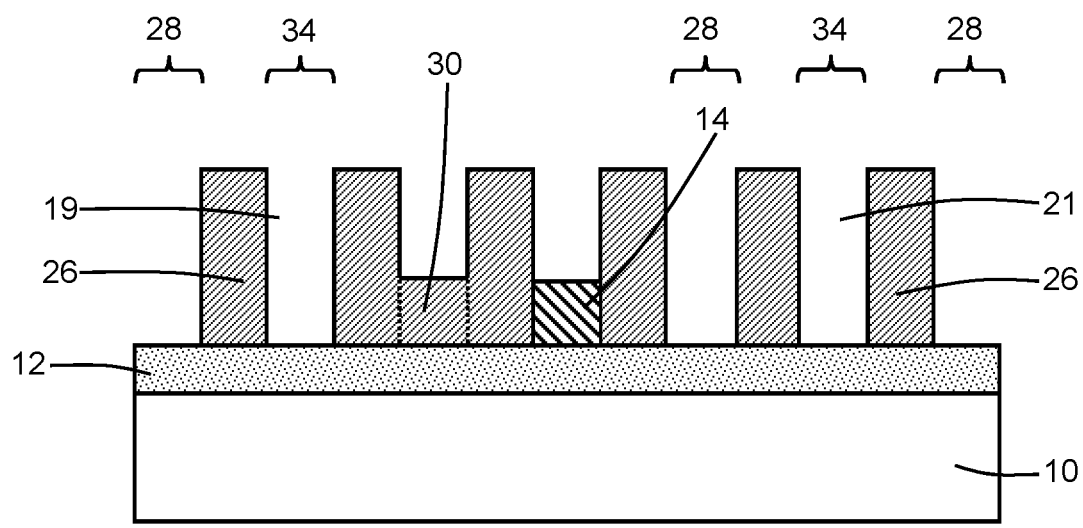
FIG. 11 is a cross-sectional view taken generally along line 11-11 in FIG. 10.

With reference to FIGS. 10, 11 in which like reference numerals refer to like features in FIG. 9 and at a subsequent fabrication stage of the processing method, the spin-on hardmask 32 is removed by, for example, ashing with a plasma, and the mandrels 19, 20, 21 are pulled and removed selective to the sidewall spacers 26, the non-mandrel cut block 30, and the block mask 14 providing the mandrel cut with an etching process having a suitable etch chemistry. The removal of the mandrels 19, 20, 21 generates mandrel lines 34 as linear spaces arranged between the sidewall spacers 26 and over which areas of the hardmask 12 are revealed. The non-mandrel lines 28 and the mandrel lines 34 are manifested as parallel lines that are arranged to alternate with each other and that expose areas on the top surface of the hardmask 12.

The block mask 14 interrupts and cuts the continuity of one of the mandrel lines 34, and divides this mandrel line 34 into discrete sections. The block mask 14 subsequently defines the location of a cut between a pair of linearly-aligned metal interconnects subsequently formed in the interlayer dielectric layer 10 using the sections of the associated mandrel line 34. The length of the block mask 14 in a direction parallel to the length of the sections of the associated mandrel line 34 determines a tip-to-tip space or distance, dl, between these sections, and subsequently determines a tip-to-tip space or distance between the tips or ends of the metal interconnects terminating at the block mask 14 and facing each other across the length of the block mask 14. The tip-to-tip distance between the ends of the sections of the mandrel line 34, which is defined independent of the formation of the sidewall spacers 26, may be greater than a space equal to twice the thickness of the sidewall spacers 26. The tip-to-tip distance between the ends of the sections of the mandrel line 34 may be varied by selecting the length of the block mask 14, and provides for variable space mandrel cuts that can be produced independent of the spacer thickness.

Figure 12:
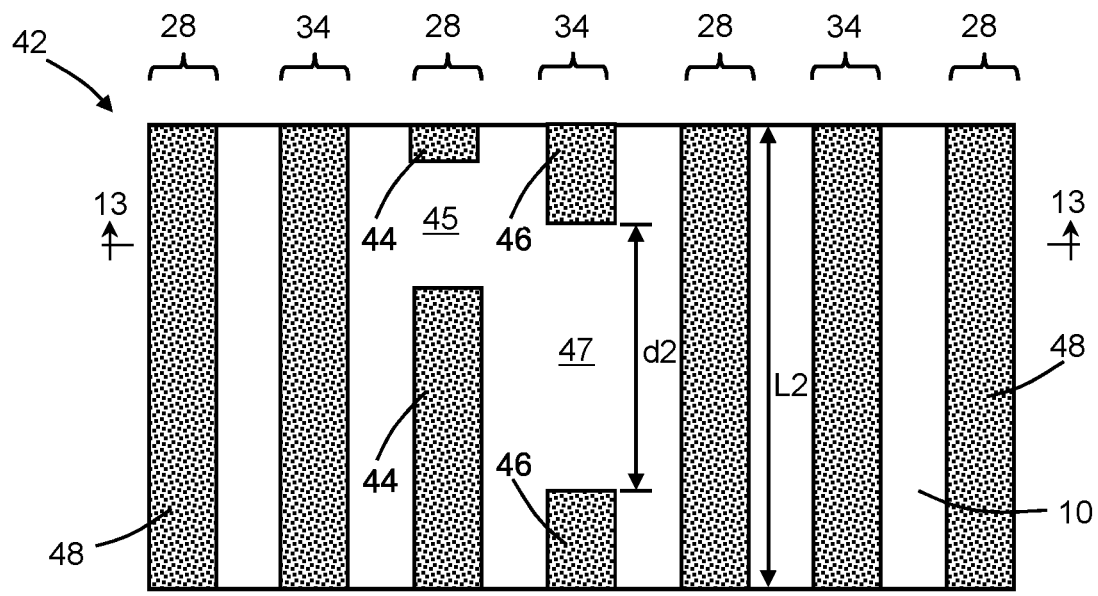
FIG. 12 is a top view of the structure at a fabrication stage of the processing method subsequent to FIGS. 10, 11.
Figure 13:
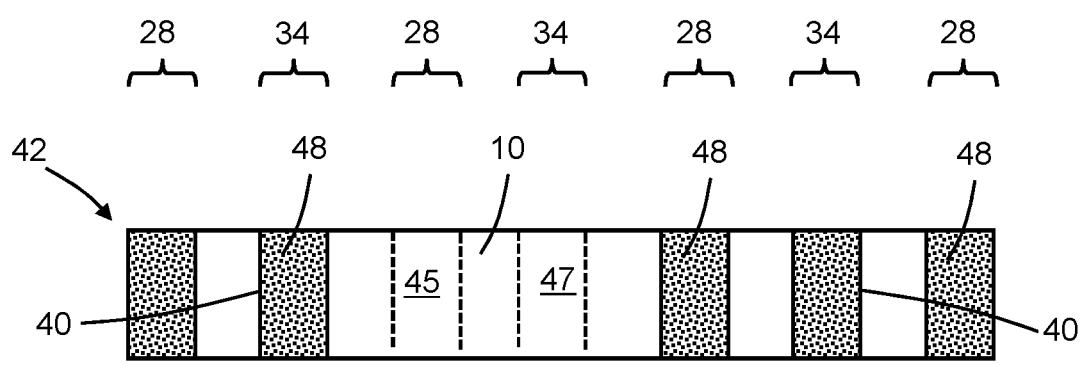
FIG. 13 is a cross-sectional view taken generally along line 13-13 in FIG. 12.

With reference to FIGS. 12, 13 in which like reference numerals refer to like features in FIGS. 10, 11 and at a subsequent fabrication stage of the processing method, the hardmask 12 is patterned by an etching process to transfer the pattern of non-mandrel lines 28 and the mandrel lines 34 to the hardmask 12 with the block mask 14, the sidewall spacers 26, and non-mandrel cut block 30 operating as an etch mask. The block mask 14, the sidewall spacers 26, and non-mandrel cut block 30 may be stripped after the pattern is transferred. The interlayer dielectric layer 10 is then patterned by an etching process with the patterned hardmask 12 operating as an etch mask to transfer the pattern of non-mandrel lines 28 and the mandrel lines 34 to the interlayer dielectric layer 10 as trenches 40. The interlayer dielectric layer 10 is masked by the hardmask 12 and preserved over the areas formerly covered by the block mask 14 and non-mandrel cut block 30.

A back-end-of-line (BEOL) interconnect structure 42 is formed by filling the trenches 40 in the interlayer dielectric layer 10 with a conductor to form interconnects 44, 46, 48 as features in the form of wires that are embedded in the interlayer dielectric layer 10. A liner (not shown) comprised of titanium (Ti), titanium nitride (TiN), tantalum (Ta), tantalum nitride (TaN), or a layered combination of these materials (e.g., a bilayer of TaN/Ta) may be applied to the trenches 40 before filling with a primary electrical conductor. The primary conductor may be comprised of a low-resistivity metal formed using a deposition process, such as copper (Cu) or cobalt (Co) deposited by electroplating or electroless deposition. The shapes and geometries of the interconnects 44, 46, 48 reflect the areas exposed for trench formation in the interlayer dielectric layer 10 by the patterned hardmask 12. In an embodiment, the interconnects 44, 46, 48 may be conductive features located in a first metallization (M0) level that is the closest of multiple metallization levels of the BEOL interconnect structure 42 to FEOL device structures, and in which the interconnects 44, 46, 48 may be connected with FEOL device structures by vertical contacts in a contact (CA) level.

The non-mandrel cut block 30 is transferred to the hardmask 12 and from the hardmask 12 to the interlayer dielectric layer 10 as a cut 45 between the linearly-aligned interconnects 44 defining an area over which the interlayer dielectric layer 10 is not etched and remains intact. The interconnects 44 have a tip-to-tip spacing or distance between their respective ends, which are broken by the presence of a portion of the dielectric material of the interlayer dielectric layer 10 in the cut 45, given by a dimension of the cut 45 parallel to the length, L2, of the interconnects 44. The interconnects 48 are continuous and unbroken.

The block mask 14 is transferred to the hardmask 12 and from the hardmask 12 to the interlayer dielectric layer 10 as a cut 47 between the linearly-aligned interconnects 46 defining an area over which the interlayer dielectric layer 10 is not etched and remains intact. The interconnects 46 have a tip-to-tip spacing between their respective ends, which are broken by the presence of a portion of the dielectric material of the interlayer dielectric layer 10 in the cut 47, given by a dimension of the cut 47 parallel to the length of the interconnects 46. The portion of the interlayer dielectric layer 10 is correlated spatially with the block mask 14 in the pattern transferred to the interlayer dielectric layer 10.

The tip-to-tip spacing for the cut 45 is not limited to a distance equal to twice the thickness of the sidewall spacers. Because the cut 45 is formed using the block mask 14 instead of the sidewall spacers 26, the tip-to-tip spacing of the interconnects 46 can exceed this distance without any susceptibility to shorting the interconnect lines. The tip-to-tip spacing for the cut 45 is a variable space that can be selected as part of the device design. In addition, because the sidewall spacers 26 do not have to wrap about the tips of the sections of the cut mandrel, indents are absent that could otherwise produce metal asperities projecting from the side edges of the interconnects adjacent into the cut 45.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms such as "vertical", "horizontal", "lateral", etc. are made by way of example, and not by way of limitation, to establish a frame of reference. Terms such as "horizontal" and "lateral" refer to a directions in a plane parallel to a top surface of a semiconductor substrate, regardless of its actual three-dimensional spatial orientation. Terms such as "vertical" and "normal" refer to a direction perpendicular to the "horizontal" and "lateral" direction. Terms such as "above" and "below" indicate positioning of elements or structures relative to each other and/or to the top surface of the semiconductor substrate as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
depositing a hardmask over an interlayer dielectric layer;
forming a first block mask that covers a first area on the hardmask;
forming a sacrificial layer over the first block mask and the hardmask;
patterning the sacrificial layer to form a first mandrel that extends across the first block mask; and
forming a sidewall spacer located on the hardmask and adjacent to the first mandrel,
wherein the first block mask and the sidewall spacer are comprised of titanium oxide.

2. The method of claim 1 wherein a second mandrel is formed on the hardmask, the second mandrel is separated from the first mandrel by a non-mandrel line exposing a second area on the hardmask, and further comprising:
after forming the first block mask, forming a second block mask covering a portion of the second area of the hardmask exposed by the non-mandrel line.

3. The method of claim 1 wherein the sacrificial layer is comprised of an organic material.

4. The method of claim 1 further comprising:
removing the first mandrel to provide a mandrel line exposing a second area on the hardmask; and
etching the hardmask with a first etching process to transfer a pattern based on the mandrel line and the first block mask to the hardmask.

5. The method of claim 4 further comprising:
etching the interlayer dielectric layer with a second etching process to transfer the pattern from the hardmask to form a plurality of trenches in the interlayer dielectric layer; and
filling the plurality of trenches with a conductor to form a first interconnect and a second interconnect aligned in a row with the first interconnect,
wherein a portion of the interlayer dielectric layer is arranged between an end of the first interconnect and an end of the second interconnect, and the portion of the interlayer dielectric layer is correlated spatially with the first block mask in the pattern.

6. The method of claim 4 wherein the first block mask is exposed after removing the first mandrel and interrupts the mandrel line as a cut.

7. A method comprising:
depositing a hardmask over an interlayer dielectric layer;
forming a first block mask that covers a first area on the hardmask;
forming a sacrificial layer over the first block mask and the hardmask;
patterning the sacrificial layer to form a first mandrel that extends across the first block mask, wherein the first mandrel has a first width after patterning the sacrificial layer, the first block mask has a second width after patterning the sacrificial layer, and the second width is greater than the first width; and
trimming the first block mask to reduce the second width of the first block mask,
wherein the second width of the first mandrel is unchanged when the first block mask is trimmed, and after trimming, the second width of the first block mask is equal to the first width of the first mandrel.

8. The method of claim 7 wherein the sacrificial layer is comprised of an organic material.

9. The method of claim 7 further comprising:
after forming the first block mask, forming a sidewall spacer on the hardmask and adjacent to the first mandrel,
wherein the first block mask is comprised of silicon dioxide, and the sidewall spacer is comprised of silicon dioxide.

10. The method of claim 7 further comprising:
after forming the first block mask, forming a sidewall spacer on the hardmask and adjacent to the first mandrel,
wherein the first block mask is comprised of titanium oxide, and the sidewall spacer is comprised of titanium oxide.

11. A method comprising:
depositing a hardmask over an interlayer dielectric layer;
forming a first block mask that covers a first area on the hardmask;
forming a sacrificial layer over the first block mask and the hardmask; and
patterning the sacrificial layer to form a first mandrel that extends across the first block mask,
wherein the sacrificial layer is comprised of an organic material.

12. The method of claim 11 wherein forming the sacrificial layer over the first block mask and the hardmask comprises:
applying the sacrificial layer with a spin-on process.

13. The method of claim 11 further comprising:
after forming the first block mask, forming a sidewall spacer on the hardmask and adjacent to the first mandrel.

14. The method of claim 13 wherein the first block mask is comprised of titanium oxide or silicon dioxide, and the sidewall spacer is comprised of titanium oxide or silicon dioxide.

15. The method of claim 13 wherein the first block mask and the sidewall spacer are comprised of silicon dioxide.

16. The method of claim 13 wherein the first block mask is comprised of a first material, and the sidewall spacer is comprised of a second material.

17. The method of claim 16 wherein the first material is titanium oxide or silicon dioxide, and the second material is titanium oxide or silicon dioxide.

18. The method of claim 13 wherein the first mandrel has a first length, the sidewall spacer has a thickness, the first block mask has a second length parallel to the first length of the first mandrel, and the second length is greater than twice the thickness of the sidewall spacer.

19. The method of claim 18 wherein the first mandrel has a first width after patterning the sacrificial layer, the first block mask has a second width after patterning the sacrificial layer, and the second width is greater than the first width.

20. The method of claim 19 further comprising:
performing a self-aligned etching process to etch the first block mask such that the second width of the first block mask is reduced to be equal to the first width of the first mandrel.

* * * * *